May 14, 1968 C. F. WHEATLEY, JR 3,383,609
PUSH-PULL AMPLIFIER CIRCUIT
Filed Dec. 4, 1964
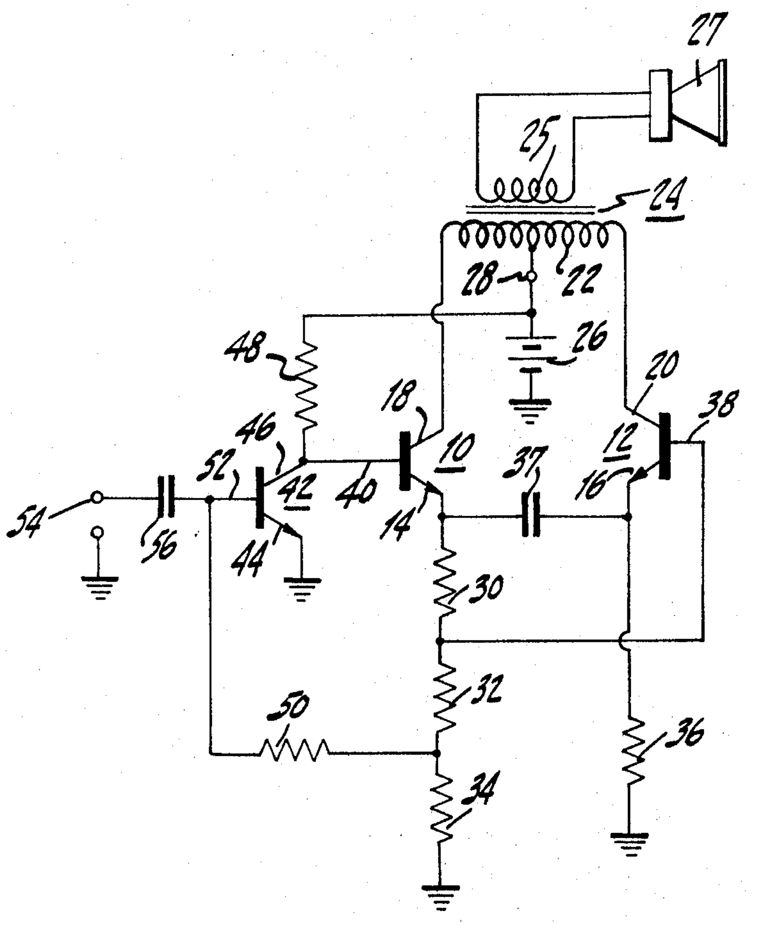
INVENTOR.
CARL F. WHEATLEY, JR
BY
Eugene M. Whitacre
ATTORNEY

United States Patent Office 3,383,609

Patented May 14, 1968

3,383,609

PUSH-PULL AMPLIFIER CIRCUIT

Carl Franklin Wheatley, Jr., Somerset, N.J., assignor to Radio Corporation of America, a corporation of Delaware Filed Dec. 4, 1964, Ser. No. 415,954

8 Claims. (Cl. 330—15)

ABSTRACT OF THE DISCLOSURE

A Class A push-pull amplifier which may be driven from a single ended source and which provides balanced operation over a wide range of temperatures. The amplifier includes a first transistor connected in a common emitter configuration, providing signal drive to, and the bias voltage for, an included second transistor connected in a common base configuration.

This invention relates to transistor amplifier circuits and more particularly to push-pull transistor amplifier circuits.

One form of a push-pull amplifier which has heretofore been provided includes a pair of transistors which are coupled together through a common emitter resistor. The signals to be amplified are applied to the base electrode of one of the transistors while the base electrode of the other transistor is coupled to a point of reference potential. The collectors of the two transistors are connected to drive a load in push-pull relation.

Circuits of the type described provide the advantage of requiring only a single ended signal input driver circuit. However, it has been found that these circuits require tight balances on components to exhiblit balanced operation, and do not maintain balanced operation with changes in temperature.

It is therefore an object of this invention to provide an improved push-pull amplifier circuit which may be driven from a single-ended signal input circuit.

It is also an object of this invention to provide an improved push-pull Class A amplifier circuit which may be driven from a single-ended signal input circuit and which exhibits balanced operation over a wide range of temperature.

It is still a further object of this invention to provide an improved push-pull Class A amplifier circuit which may be driven from a single-ended signal input circuit and which exhibits balanced operational characteristics for relatively wide tolerance variations of the amplifier component parts.

A push-pull amplifier embodying the invention includes a first transistor connected in a common-emitter mode of operation and a second transistor connected in a common-base mode of operation. The collector electrodes of the transistors are connected to drive a load circuit in push-pull relation. Separate emitter resistors are provided for the two transistors, and the emitters are capacitively coupled for signal currents. Biasing means are provided for driving the transistors from a substantially constant current source.

Input signals to be amplified are applied to the first transistor base electrode, and are capacitively coupled to the second transistor emitter electrode in a manner that substantially all the first transistor emitter electrode signal current drives the second transistor as the second half of the push-pull amplifier.

The novel features that are considered characteristic of this invention are set forth with particularity in the appended claims. The invention itself, however, both as to its organization and method of operation as well as additional objects and advantages thereof, will best be understood from the following description when read in connection with the accompanying drawing, in which the sole figure is a schematic circuit diagram of a Class A push-pull amplifier which may be driven from a single-ended signal input circuit.

The circuit includes a pair of transistors 10 and 12 which may be of either conductivity, but in the present instance are illustrated as N-P-N devices. The collector electrodes 18 and 20 of the transistors 10 and 12 respectively are connected to the extremities of a primary winding 22 of an output transformer 24 having its secondary winding 25 connected to a loudspeaker 27. The bias supply for the various electrodes of transistors 10 and 12 comprises a power supply 26, shown as a battery with its positive terminal connected to a center-tap 28 on the primary winding 22 and with its negative terminal connected to ground. An emitter electrode 14 of transistor 10 is connected to ground through the series resistors 30, 32 and 34 while the emitter electrode 16 of the transistor 12 is connected to ground through a resistor 36. The emitter electrodes 14 and 16 are capacitively coupled through a capacitor 37 which provides a low impedance path for signal frequencies and an open circuit for direct current.

The bias voltage for the base electrode 38 of transistor 12 is supplied by the voltage developed across the resistors 32 and 34. The voltages developed across the series resistors 30, 32 and 34 are substantially constant since these resistors are large enough so that the transistor emitters are driven by a constant current source.

Input signals to be amplified and base biasing voltages. are, in the present embodiment applied to the base electrode 40 of the transistor 10 by a direct coupling to a collector electrode 46 of a common-emitter driver amplifier including a transistor 42. The emitter electrode 44 of the transistor 42 is connected to ground while the collector electrode 46 is connected to the positive terminal of the power supply 26 through a resistor 48. The base bias for transistor 42 is supplied by a resistor 50 connected between the junction of resistors 32 and 34 and the base electrode 52 of transistor 42. The input signals are applied across an input terminal 54 and ground which in turn is coupled through capacitor 56 to the base electrode 52 of transistor 42.

The quiescent current through transistors 10 and 12 is primarily determined by the magnitude of the voltages applied to their respective bases 40 and 38 and by the resistance in the emitter circuits to ground (resistors 30, 32 and 34 in the case of transistor 10 and resistor 36 in the case of transistor 12). For example, if the transistors 10 and 12 are RCA TA 2301 silicon transistors, and 8 volts is developed at the base electrode 40 of transistor 10 relative to ground, and resistors 30, 32 and 34 have values of 82, 180 and 27 ohms respectively, approximately 25 milliamperes of quiescent current flows from the emitter electrode 14. Approximately 5.2 volts is developed across resistors 32 and 34 and ground. With this latter voltage being applied to base electrode 38 of transistor 12 as shown, a value of 180 ohms for the resistor 36 provides a balanced collector current of 25 milliamperes in the transistor 12.

Since the primary factors determining the current conduction of the respective transistors are the value of emitter resistors selected and the applied voltages to the respective bases, the currents through the two transistors 10 and 12 can be balanced approximately within the precision tolerance of the emitter resistors (resistors 30–36), even for relatively large variations in the characteristics of the respective transistors. A reasonable current balance in the push-pull circuit can be obtained even if different types of transistors are employed (i.e., transistor 10 is a silicon type and transistor 12 is a germanium type or vice versa), as long as the values of resistors 30–36 are selected to compensate for this difference.

The manner in which the transistor 12 is biased also has the added advantage of maintaining balanced currents in the transistors 10 and 12 despite changes in temperature. For example, if the temperature of the transistor 10 is increased more than the temperature of transistor 12, any increases in current flowing through the transistor 10 will produce a greater voltage drop across the resistors 32 and 34 thereby providing a correspondingly higher forward bias voltage at base electrode 38 of the transistor 12. This in turn will cause a corresponding increase in current in the transistor 12 tending to maintain the two currents balanced, or substantially equal. Furthermore, if the temperature of both transistors increased equally, any resulting unbalance in current due to the differences in transistor characteristics is minimized.

The biasing connections between the transistors 10 and 42 provide operating point stabilization for changes in temperature. With the power supply 26 set at 150 volts, resistors 48 and 50 set at 68 kilohms and 4.7 kilohms respectively, and employing an RCA 2N 3241 silicon transistor as the driver transistor 42, a change in temperature in a direction which tends to increase the current of all the transistors, tends to develop a counteracting voltage drop across resistor 48, which provides the D-C bias voltage for the transistor 10. In like manner the negative D-C feedback connection to the base electrode of the transistor 42 through the resistor 50 tends to maintain the current in the transistor 42 constant. The circuit stabilizes the operating point against changes in power supply voltage in a similar manner.

Since the capacitor 37 (having a value of 50 microfarads) is essentially a short circuit to signal frequencies between the emitter electrodes 14 and 16, and since the input impedance presented by the emitter electrode of the transistor 12 is very low compared to the resistance of resistors 30–36, the emitter electrodes are essentially driven by constant current sources. The constant current source tends to keep a constant D-C voltage (as determined by the quiescent operating currents) at the respective emitter electrodes.

In operation, a signal applied to the transistor 10 produces changes in the emitter 14 current. The signal current path from the emitter 14 is completed through the capacitor 37 and in the reverse direction through the base emitter path of the transistor 12. Since the signal current of the transistor 10 flows in the reverse direction through the emitter-base junction of the transistor 12, the transistor 12 current decreases when the transistor 10 current increases and vice versa, thereby providing push-pull operation. Although the emitter electrodes 14 and 16 are coupled for signal currents, they are isolated for direct currents. This permits the D-C operating points of the two transistors to be set independently, and eliminate interactions of a type which would cause the D-C currents of the two transistors 10 and 12 to change in opposite directions.

The circuit can be modified to provide for the biasing of the driver transistor 42 from the emitter circuit of the transistor 12, rather than from the transistor 10 as shown. The modification would entail the inclusion of two series resistors in the emitter current path of transistor 12, in place of the resistor 36 (having a total resistance equal to the resistor 36) and connecting the resistor 50 to the junction of the two resistors. The values of the series resistors will be selected to provide the proper bias voltage for transistor 42. This modification has the added advantage of providing for less degenerative feedback at very low frequencies and still provide for the previously mentioned advantage. For example, when the input frequency is sufficiently low so that the capacitor 37 presents a substantial impedance, the signal currents will flow through the series resistors 30–34. Any signal that appears across the resistors 32 and 34 will be degeneratively fed back (if connected as shown in the figure). At these very low frequencies, much less signal will appear in the emitter circuit of the transistor 12 (due to the impedance of capacitor 37) allowing for higher gains at the very low frequencies (less degenerate feedback) thereby expanding the low frequency response somewhat.

With the push-pull circuit of this invention, very little allowance need be set aside for saturation of the output transformer iron due to changes in the balance of the transistor quiescent currents. With substantially balanced currents for wide ranges of temperature variations and transistor characteristics, the transformer can be designed primarily for maximum expected current swing and power delivery at low frequencies. Furthermore, because of the current balance and compensation for power supply variations, less of a protective allowance can be set aside in the amplifier design as a safety factor in providing higher power output.

What is claimed is:

1. A push-pull amplifier circuit comprising:

first and second transistors, each having emitter, collector and base electrodes;

an output load impedance element;

means coupling the collector electrodes of said first and second transistors for driving said output load impedance element in push-pull relation;

first impedance means connected between the emitter electrode of said first transistor and a point of reference potential;

second impedance means connected between the emitter electrode of said second transistor and said point of reference potential;

input circuit means coupled between the base electrode of said first transistor and said point of reference potential for supplying signals to be amplified and for connecting said first transistor in a common emitter mode of operation;

bias circuit means connected between the base electrode of said second transistor and a point on said first impedance means remote from the emitter electrode of said first transistor and at a relatively low signal potential for establishing the operating point of said second transistor; and signal coupling means connected between the emitter electrodes of said first and second transistors for coupling signal drive from said first transistor to said second transistor and for connecting said second transistor in a common base mode of operation.

2. A push-pull amplifier circuit comprising:

first and second transistors, each having emitter, collector and base electrodes;

a transformer including a primary winding having a center-tap adapted to be connected to a source of energizing potential, and a secondary winding adapted to be connected to a utilizing circuit;

means coupling the collector electrode of said first transistor to one end of said primary winding and coupling the collector electrode of said second transistor to the other end of said primary winding;

first impedance means connected between the emitter electrode of said first transistor and a point of reference potential;

second impedance means connected between the emitter electrode of said second transistor and said point of reference potential;

input circuit means coupled between the base electrode of said first transistor and said point of reference potential for supplying signals to be amplified and for connecting said first transistor in a common emitter mode of operation;

bias circuit means connecting the base electrode of said second transistor to said first impedance means at a point thereon remote from said first transistor emitter electrode and at a relatively low signal potential for establishing the operating point of said second transistor; and capacitive coupling means connected between the emitter electrodes of said first and second transistors for coupling signal drive from said first transistor to said second transistor and for connecting said second transistor in a common base mode of operation.

3. A Class A push-pull amplifier circuit requiring a single ended input signal comprising:

first and second transistors, each having emitter, collector, and base electrodes;

means connecting said first transistor in a common-emitter mode of operation;

means connecting said second transistor in a common-base mode of operation;

circuit means connecting the collector electrodes of said first and second transistor to an output circuit, an intermediate point on said output circuit being adapted to be connected to a source of energizing potential;

input circuit means connected to the base electrode of said first transistor to provide a source of signals to be amplified and to bias said first transistor for a given quiescent current;

biasing means connected between said first and said second transistors for providing a quiescent current in said second transistor substantially equal to said first transistor quiescent current and, capacitive coupling means connected between the emitter electrodes of said first and second transistors for coupling signal drive from said first transistor to said second transistor.

4. A push-pull amplifier circuit requiring a single ended input signal comprising:

first and second transistors, each having emitter, collector, and base electrodes;

means connecting said first transistor in a common-emitter mode of operation;

means connecting said second transistor in a common-base mode of operation;

a load impedance element;

means coupling the collector electrodes of said first and second transistors for driving said load impedance element in push-pull relation;

input circuit means connected to the base electrode of said first transistor to provide a source of signals to be amplified and to bias said first transistor for a given quiescent current;

biasing means connected between said first and said second transistors for establishing a quiescent operating current in said second transistor, and capacitive coupling means connected between the emitter electrodes of said first and second transistors for coupling signal drive from said first transistor to said second transistor.

5. A Class A push-pull amplifier system comprising:

a first, second and third semiconductor devices each including base, emitter and collector electrodes;

an output transformer including a primary winding having a center-tap;

a source of energizing potential connected between said center-tap and a point of reference potential;

means connecting the collector electrodes of said first and second semiconductor devices to opposite ends of said primary winding;

first biasing means including at least two series resistors connected between the emitter electrode of said first semiconductor device and said point of reference potential;

second biasing means including at least one resistor connected between the emitter electrode of the said second of semiconductor device and said point of reference potential;

input circuit means connected to said base electrode of said first semiconductor device for providing a source of signals to be amplified and a biasing means for establishing the quiescent current flow through said first semiconductor device, said input circuit including said third transistor connected in a common-emitter amplifier mode of operation;

circuit means connecting the base electrode of said second semiconductor device to said first biasing means remote from said emitter electrode of said first semiconductor device whereby said connection provides for a quiescent operating current flow through said second semiconductor device that is substantially equal to the first semiconductor quiescent current and remains substantially equal with fluctuations in operating temperature;

means connecting the base electrode of said third transistor to one of said first and second biasing circuits so that said input circuit maintains the quiescent operating current of said first semiconductor device substantially constant for fluctations in said source of operating potential and changes in ambient temperature, and a capacitor coupled between said emitter electrodes of said first and second semiconductor devices that presents essentially a short circuit for signal frequencies so that substantially all the signal current flow through the emitter electrode of said first semiconductor device flows through the emitter electrode of said second semiconductor device in a manner that the collector currents of said first and second semiconductor devices are aiding in developing an output signal across said primary winding.

6. A push-pull amplifier system comprising:

a first, second and third transistors having emitter, collector, and base electrodes;

means connecting said third transistor in a common-emitter mode of operation;

a load impedance element;

means coupling the collector electrode of said first and second transistors for driving said load impedance element in a push-pull relation;

circuit means connecting the collector electrode of said third transistor to said base electrode of said first transistor to provide a driver amplifier to drive said first transistor and to bias said first transister for a given quiescent current;

input circuit means coupled to the base electrode of said third transistor;

first impedance means connected between the emitter electrode of said first transistor and a point of reference potential;

second impedance means connected between the emitter electrode of said second transistor and said point of reference potential;

bias means connected to the base electrode of said second transistor for establishing the operating point of said second transistor;

third impedance means connected between said third transistor base electrode and one of said first and second impedance means for biasing said third transistor, and signal coupling means for blocking direct current flow and provide efficient coupling at signal frequencies connected between the emitter electrodes of said first and second transistors.

7. A push-pull amplifier circuit comprising:

first and second transistors, each having emitter, collector and base electrodes;

an output load impedance element having an intermediate point adapted to be connected to a source of energizing potential;

direct current connections from the collector electrodes of said first and second transistors to the opposite ends of said load impedance element;

a pair of serially coupled resistors connected between the emitter electrode of said first transistor and a point of reference potential and providing a relatively low signal potential at the junction thereof;

a resistor connected between the emitter electrode of said second transistor and said point of reference potential;

an input signal circuit coupled between the base electrode of said first transistor and said point of reference potential for supplying signals to be amplified and for establishing the operating point of said first transistor;

a direct current connection from the junction between said pair of serially coupled resistors to the base electrode of said second transistor for establishing the operating point of said second transistor; and signal coupling means connected between the emitter electrodes of said first and second transistors for coupling signal drive from said first transistor to said second transistor.

8. A push-pull amplifier circuit comprising:

first and second transistors, each having emitter, collector and base electrodes, an output load impedance element having an intermediate point adapted to be connected to a source of energizing potential;

direct current connections from the collector electrodes of said first and second transistors to the opposite ends of said load impedance element;

a trio of serially coupled resistors connected between the emitter electrode of said first transistor and a point of reference potential and providing relatively low signal potentials at the two junctions of said resistors;

a resistor connected between the emitter electrode of said second transistor and said point of reference potential;

a source of input signals;

a transistor amplifier circuit having an input terminal coupled to said source, and an output terminal coupled to the base electrode of said first transistor for supplying signals to be amplified by said push-pull circuit and for establishing the operating point of said first transistor;

a direct current connection to the base electrode of said second transistor from the junction between the pair of said serially coupled resistors close to the emitter electrode of said first transistor for establishing the operating point of said second transistor;

a resistor connected between said transistor amplifier input terminal and the junction between the pair of said serially coupled resistors closer to said point of reference potential for stabilizing the operating point of said amplifier circuit; and signal coupling means connected between the emitter electrodes of said first and second transistors for coupling signal drive from said first transistor to said second transistor.

References Cited

UNITED STATES PATENTS 2,762,874 9/1956 Barco ---------------- 330—15

ROY LAKE, *Primary Examiner.*

E. C. FOLSOM, *Assistant Examiner.*